United States Patent
Nam et al.

(10) Patent No.: US 9,480,140 B2
(45) Date of Patent: Oct. 25, 2016

(54) MATERIAL MODIFICATION BY NEUTRAL BEAM SOURCE WITH SELECTED COLLISION ANGLE

(71) Applicant: APPLIED MATERIALS, INC., Santa Clara, CA (US)

(72) Inventors: Sang Ki Nam, Danville, CA (US); Ludovic Godet, Sunnyvale, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 214 days.

(21) Appl. No.: 14/549,829

(22) Filed: Nov. 21, 2014

(65) Prior Publication Data

US 2016/0148713 A1    May 26, 2016

(51) Int. Cl.
*H05H 3/02* (2006.01)
*H05H 3/06* (2006.01)
*H01J 37/32* (2006.01)

(52) U.S. Cl.
CPC ............ *H05H 3/06* (2013.01); *H01J 37/32357* (2013.01); *H01J 37/32366* (2013.01); *H01J 37/32422* (2013.01); *H01J 2237/0041* (2013.01); *H05H 3/02* (2013.01)

(58) Field of Classification Search
CPC .............. H01J 37/3171; H01J 2237/0041; H01J 37/147; H01J 2237/15; H01J 2237/1503; H01J 37/3174; H05H 3/00
See application file for complete search history.

(56) References Cited

U.S. PATENT DOCUMENTS

| | | | | |
|---|---|---|---|---|
| 4,128,765 A * | 12/1978 | Franks | ................... | G01N 1/32 204/192.34 |
| 4,588,955 A * | 5/1986 | Anderson | ................ | G21K 1/08 250/423 R |
| 4,873,467 A | 10/1989 | Kaufman et al. | | |
| 5,776,253 A * | 7/1998 | Asakawa | ................ | C23C 16/48 117/103 |
| 6,065,499 A | 5/2000 | Pless et al. | | |
| 6,635,578 B1 * | 10/2003 | Xu | ..................... | H01J 37/32009 438/706 |
| 8,944,385 B2 | 2/2015 | Harmann et al. | | |
| 2005/0174063 A1 | 8/2005 | Kornfeld et al. | | |
| 2005/0212442 A1 | 9/2005 | Kornfeld et al. | | |
| 2006/0057303 A1 * | 3/2006 | Agarwal | ............... | H01J 37/304 427/523 |
| 2007/0269612 A1 * | 11/2007 | Bijker | ....................... | C23C 4/12 427/569 |
| 2011/0073713 A1 | 3/2011 | Harmann et al. | | |
| 2011/0080085 A1 | 4/2011 | Harmann et al. | | |
| 2013/0032708 A1 | 2/2013 | Kern et al. | | |
| 2014/0272179 A1 * | 9/2014 | Radovanov | ....... | H01J 37/32357 427/523 |
| 2015/0090583 A1 * | 4/2015 | Kodaira | ............ | H01J 37/32357 204/192.34 |

OTHER PUBLICATIONS

Official Action Dated Oct. 22, 2015 Issued in Co-Pending U.S. Appl. No. 14/549,854.
Molvik, A.W., et al. "Geometrically focused neutral beam accelerators". Review of Scientific Instruments, Jul. 1981, pp. 965-970, vol. 52, American Institute of Physics, United States.
U.S. Patent Application as filed Nov. 21, 2014 in Co-Pending U.S. Appl. No. 14/549,854.
Panda, S., et al. "Anistropic etching of polymer films by high energy oxygen atom neutral beams", J. Vac. Sci. Technol. A., 2001, pp. 398-404, 19(2), USA.

(Continued)

*Primary Examiner* — Brooke Purinton
(74) *Attorney, Agent, or Firm* — Robert M. Wallace (57) ABSTRACT

A neutral beam is scanned across a workpiece surface and the beam angle is controlled in a manner that avoids variation in the beam source-to-workpiece distance during scanning.

20 Claims, 6 Drawing Sheets

(56) References Cited

OTHER PUBLICATIONS

Ichiki, K., et al. "Characterization of neutral beam source using dc cold cathode discharge and its application processes", J.Phys. D: Appl Phys., 2008, pp. 1-14, V 41, USA.

Economou, D. J. "Fast (tens to hundreds of eV) neutral beams for materials processing", J. Phys. D: Appl. Phys., 2008, pp. 1-11, V 41, USA.

Economou, D.J. "Modeling and Simulation of Fast Neutral Beam Sources for Materials Processing", Plasma Process. Polym. Journal, 2009, pp. 308-319, V 6, Germany.

* cited by examiner

MATERIAL MODIFICATION BY NEUTRAL BEAM SOURCE WITH SELECTED COLLISION ANGLE

BACKGROUND

1. Technical Field

The disclosure concerns treatment for material modification of a workpiece by a neutral beam.

2. Background Discussion

Treatment modification of surface material of a workpiece such as a semiconductor wafer using an ion beam is well-known. Such treatment may include localized film property modification by a directional beam to enable selectivity improvement. Surface properties may be altered to enhance or inhibit nucleation, deposition and etching of the material. Use of an ion beam for such purposes involves certain limitations. For example, there is no independent control of beam angle and beam energy for an ion beam. Further, the ion beam spreads as it propagates toward the workpiece due to space charge. More importantly, the ion beam charges the surface of the workpiece, which can lead to damage of features formed on the workpiece. One solution to such problems is to employ a neutral beam instead of an ion beam. One need is to provide for independent control of energy and impact angle at the workpiece of the neutral beam.

SUMMARY

A method of treating a workpiece comprises: producing a line beam comprising a sheet of neutral species by directing ions through an elongate slit of a neutralization grid of a neutral beam source; holding the workpiece in a path of the line beam to produce an elongate beam impact zone on a surface of the workpiece; translating the workpiece relative to the line beam in a scan direction transverse to the elongate beam impact zone; and setting a collision angle of the line beam relative to the surface of the workpiece to a desired value by rotating the neutral beam source.

In one embodiment, the operation of rotating comprises moving the neutral beam source in an orbital motion about a rotation axis external of the neutral beam source. In a further embodiment, the rotation axis coincides with the elongate beam impact zone on the surface of the workpiece. In a yet further embodiment, the rotation axis is a line corresponding to the beam impact zone. In one embodiment, the operation of rotating further comprises continually facing the elongate slit toward a stationary location on the surface of the workpiece. The stationary location can be the beam impact zone.

In accordance with another aspect, a method is provided for treating a workpiece, the method comprising: producing a plurality of respective line beams comprising respective sheets of neutral species by directing ions through respective elongate slits of respective neutralization grids of respective neutral beam sources; holding the workpiece in respective paths of the respective line beams to produce respective elongate beam impact zones on a surface of the workpiece; translating the workpiece relative to the respective line beams in a scan direction transverse to the elongate beam impact zones; and setting respective collision angles of the respective line beams relative to the surface of the workpiece to respective desired values by rotating the respective neutral beam sources.

In one embodiment, the operation of rotating comprises moving each of the neutral beam sources in respective orbital motions about respective rotation axes external of the respective neutral beam sources. In one embodiment, the rotation axes coincide with respective ones of the elongate beam impact zones on the surface of the workpiece. In one embodiment, the rotation axes comprise respective lines corresponding to the respective beam impact zones. In one embodiment, the operation of rotating further comprises continually facing the respective elongate slits toward respective stationary locations on the surface of the workpiece. The respective stationary locations may comprise the respective beam impact zones.

In accordance with a yet further aspect, a method of treating a workpiece is provided, the method comprising: producing a line beam comprising a sheet of neutral species by directing ions through an elongate slit of a neutralization grid of a neutral beam source; holding the workpiece in a path of the line beam to produce an elongate beam impact zone on a surface of the workpiece; translating the workpiece relative to the line beam in a scan direction transverse to the elongate beam impact zone; and setting a collision angle of the line beam relative to the surface of the workpiece to a desired value by positioning the neutralization grid at an angle relative to the surface of the workpiece at which the collision angle corresponds to the desired value. In one embodiment, the operation of producing comprises producing respective line beams comprising respective sheets of neutral species by directing ions through respective elongate slits of respective neutralization grids; the operation of holding comprises holding the workpiece in paths of the respective line beams to produce respective elongate beam impact zones on a surface of the workpiece; and the operation of setting comprises setting respective collision angles of the respective line beams relative to the surface of the workpiece to respective desired values by positioning the respective neutralization grids to respective angles relative to the surface of the workpiece at which the respective collision angles correspond to the respective desired values.

One embodiment further comprises providing different beam acceleration voltages within different ones of the respective neutralization beam sources, whereby the respective neutral beams have different energies, providing independent control of beam energy and beam angle.

BRIEF DESCRIPTION OF THE DRAWINGS

So that the manner in which the exemplary embodiments of the present invention are attained can be understood in detail, a more particular description of the invention, briefly summarized above, may be had by reference to the embodiments thereof which are illustrated in the appended drawings. It is to be appreciated that certain well known processes are not discussed herein in order to not obscure the invention.

To facilitate understanding, identical reference numerals have been used, where possible, to designate identical elements that are common to the figures. It is contemplated that elements and features of one embodiment may be beneficially incorporated in other embodiments without further recitation. It is to be noted, however, that the appended drawings illustrate only exemplary embodiments of this invention and are therefore not to be considered limiting of its scope, for the invention may admit to other equally effective embodiments.

DETAILED DESCRIPTION

Figures 1, 1A:
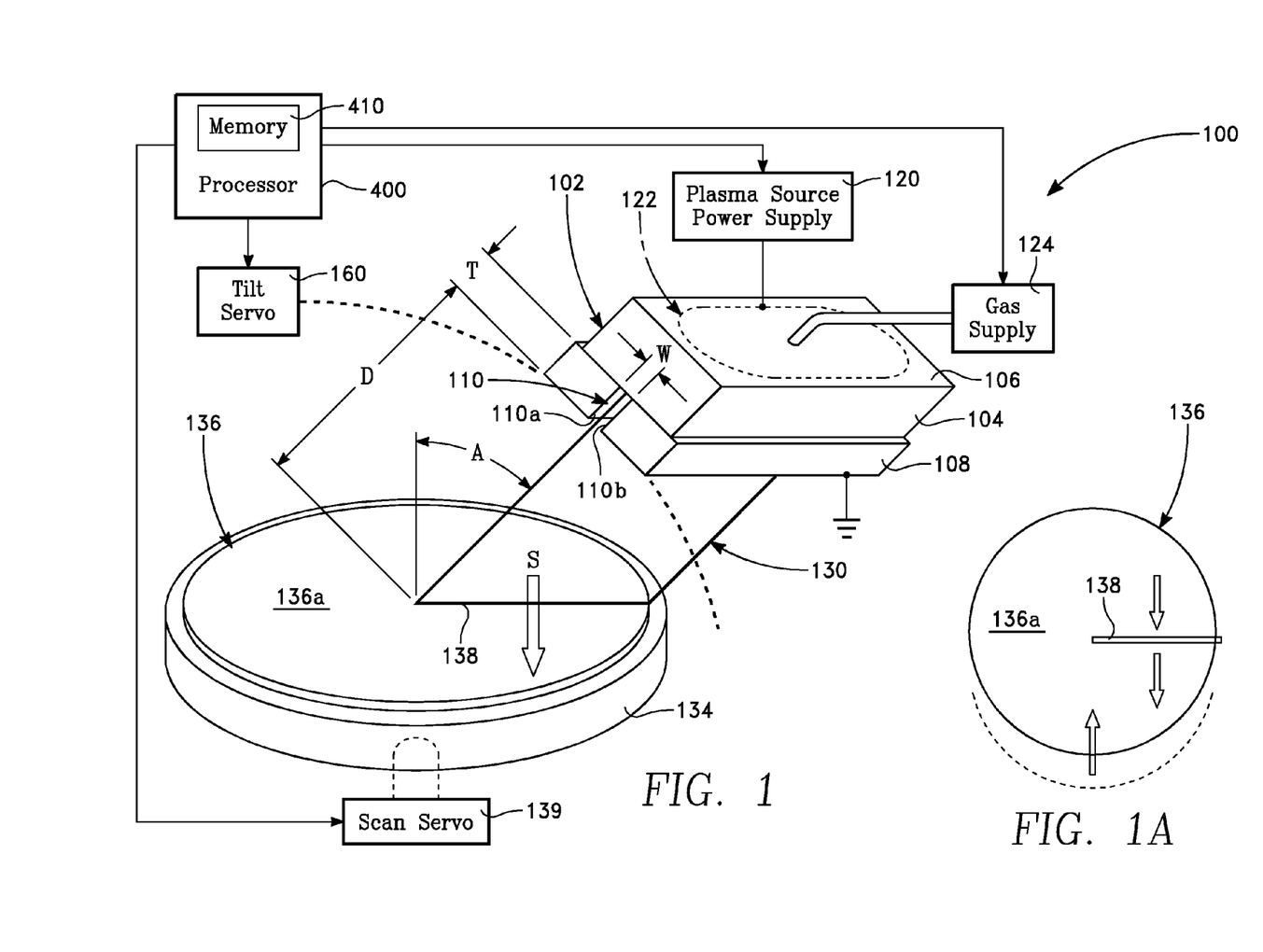
FIG. 1 depicts apparatus including a neutral beam source and a scanning support stage for carrying out a first embodiment.
FIG. 1A is a plan view corresponding to FIG. 1.

Referring to FIGS. 1 and 1A, a neutral beam source 100 includes a plasma chamber 102 enclosed by side walls 104, a ceiling 106 and a neutralization grid 108. The neutralization grid 108 is a solid body of a thickness T formed of an electrically conductive material and has a single elongate slit 110 that opens into the interior of the plasma chamber 102. Generally, the elongate slit 110 is the only opening through the neutralization grid 108. The neutralization grid 108 may be connected to ground or may be connected to an RF or D.C. voltage source. The elongate slit 110 has opposing interior side walls 110a and 110b separated by a distance defining a width W of the elongate slit 110. A plasma source power supply 120 provides power to a plasma source power applicator 122 on or adjacent the plasma chamber 102. The plasma source power supply 120 may be an RF power generator with an impedance match or a D.C. power supply or a microwave generator, for example. The plasma source power applicator 122 may be an electrode or an RF-driven coil or a microwave waveguide, for example. A gas supply 124 provides a process gas into the plasma chamber 102. Plasma source power is coupled into the chamber by the plasma source power applicator 122 and ionizes the process gas to generate a plasma within the plasma chamber 102. Ions of the plasma exit the plasma chamber 102 through the elongate slit 110, and their energy may be controlled (for example) by controlling a beam acceleration voltage within the neutral beam source 100. This beam acceleration voltage may be (for example) the voltage difference between the plasma source power applicator 122 and the neutralization grid 108. The ions undergo glancing collisions with the interior side walls 110a and 110b as they exit through the elongate slit 110. Such collisions transform the ions to neutral species, producing a line beam 130 of neutral species emanating from the elongate slit 110. The line beam 130 is generally a flat thin sheet of neutral species having a thickness corresponding to the width W of the elongate slit 110. The direction of the line beam 130 coincides with the direction of the elongate slit 110.

A support stage 134 supports a workpiece 136 in the path of the line beam 130. The workpiece 136 may be a semiconductor wafer, for example. The line beam 130 impacts top surface 136a of the workpiece 136 in a thin elongate impact zone or line 138 depicted in FIG. 1A. A scan servo 139 translates the support stage 134 in a scan direction S orthogonal (or transverse) to the line 138, as depicted in FIG. 1A.

Figure 2:
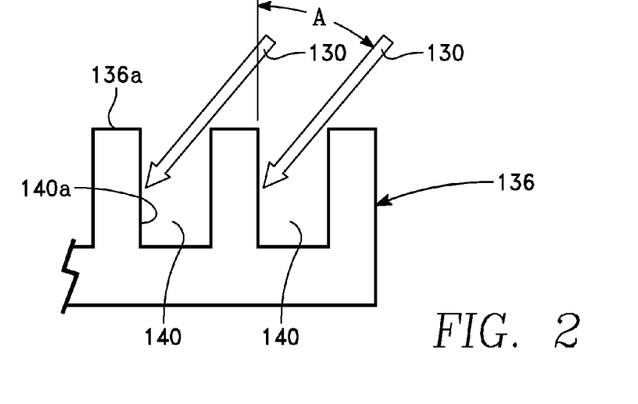
FIG. 2 is a cross-sectional view of a semiconductor wafer and depicts material treatment in the embodiment of FIG. 1.

FIG. 2 is a simplified cross-sectional view of the workpiece 136, depicting 3-dimensional features including openings 140 (which may be high aspect ratio openings) in the top surface 136a of the workpiece 136. FIG. 2 depicts how interior side wall surfaces 140a of the openings 140 are treated with the line beam 130.

The angle A (FIG. 2) at which the line beam 130 impacts the workpiece 136 relative to the interior side wall surface 140a determines the manner in which the neutral beam interacts with the interior side wall surfaces of the openings 140 for material modification. There is a need to set or control the angle A in accordance with process requirements. The problem is how to set or change the angle A without introducing non-uniformity or variations in the workpiece-to-beam source distance D as the workpiece is translated in the scan direction S. One choice may be to tilt the workpiece 136 and support stage 134. However, such tilting can introduce non-uniformity or variations in the workpiece-to-beam source distance D as the workpiece is translated in the scan direction S by the support stage 134.

The problem is solved by tilting the neutral beam source 100 about an axis until the desired tilt angle is reached, while not tilting the support stage 134 or workpiece 136. By allowing the support stage 134 and the workpiece 136 to remain untilted, the introduction of non-uniformities in the workpiece-to-beam source distance during scanning is avoided, a significant advantage. This in turn enables the workpiece 136 and support stage 134 to be translated along the scan direction S while ensuring that the workpiece-to-beam source distance D remains uniform during the entire scan.

In one embodiment, the axis about which the neutral beam source is tilted (rotated) coincides with the line 138. This requires an orbital-like motion of the neutral beam source 100 about the axis or line 138. This feature provides the advantage of keeping the beam impact zone or line 138 stationary relative to a fixed frame of reference while the neutral beam source 100 is tilted (rotated).

In accordance with the foregoing, a tilt servo 160 coupled to the neutral beam source 100 can be provided to achieve the desired tilt angle of the neutral beam source 100. In one embodiment, the tilt servo 160 moves the neutral beam source 100 in an orbital-like motion about an axis of rotation coinciding with the line 138, until the desired tilt angle A is reached. This orbital-like motion is indicated in dashed line in FIG. 1.

Figure 3:
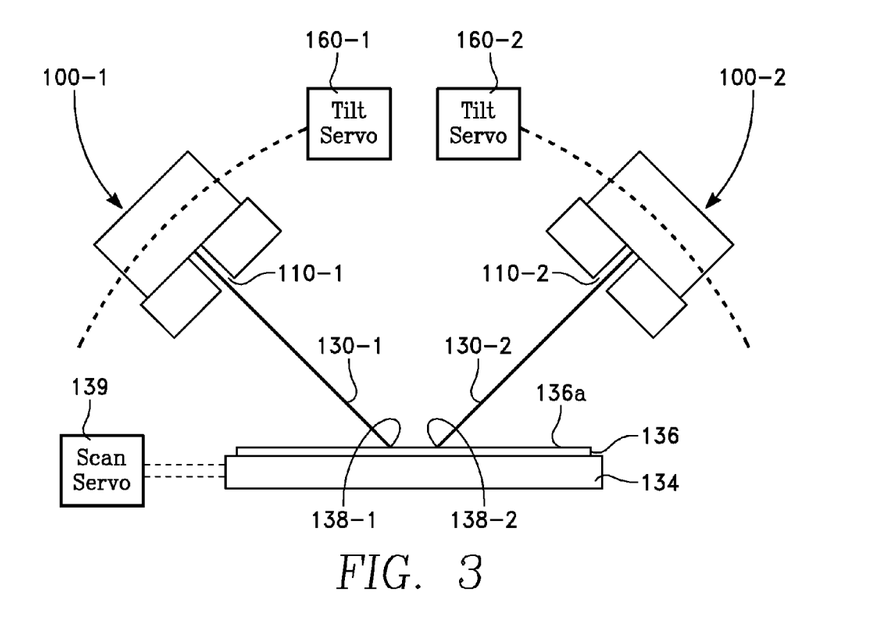
FIG. 3 depicts apparatus including two neutral beam sources and a scanning support stage for carrying out a second embodiment.

FIG. 3 depicts an embodiment in which two neutral beam sources 100-1, 100-2 having respective parallel slits 110-1, 110-2, overlie the support stage 134 and produce line beams 130-1, 130-2, defining respective impact zones or lines 138-1, 138-2 on the top surface 136a of the workpiece 136. Respective tilt servos 160-1, 160-2 move the respective neutral beam sources 100-1, 100-2 in respective orbital-like motions of the type described above with reference to FIG. 1 about respective axes coinciding with the lines 138-1, 138-2 respectively. The neutral beam sources 100-1, 100-2 are independent and may be controlled to produce the respective line beams 130-1, 130-2 with different beam energies. This facilitates the simultaneous treatment of the workpiece 136 with two different beam energies at two different beam tilt angles.

Figure 4:
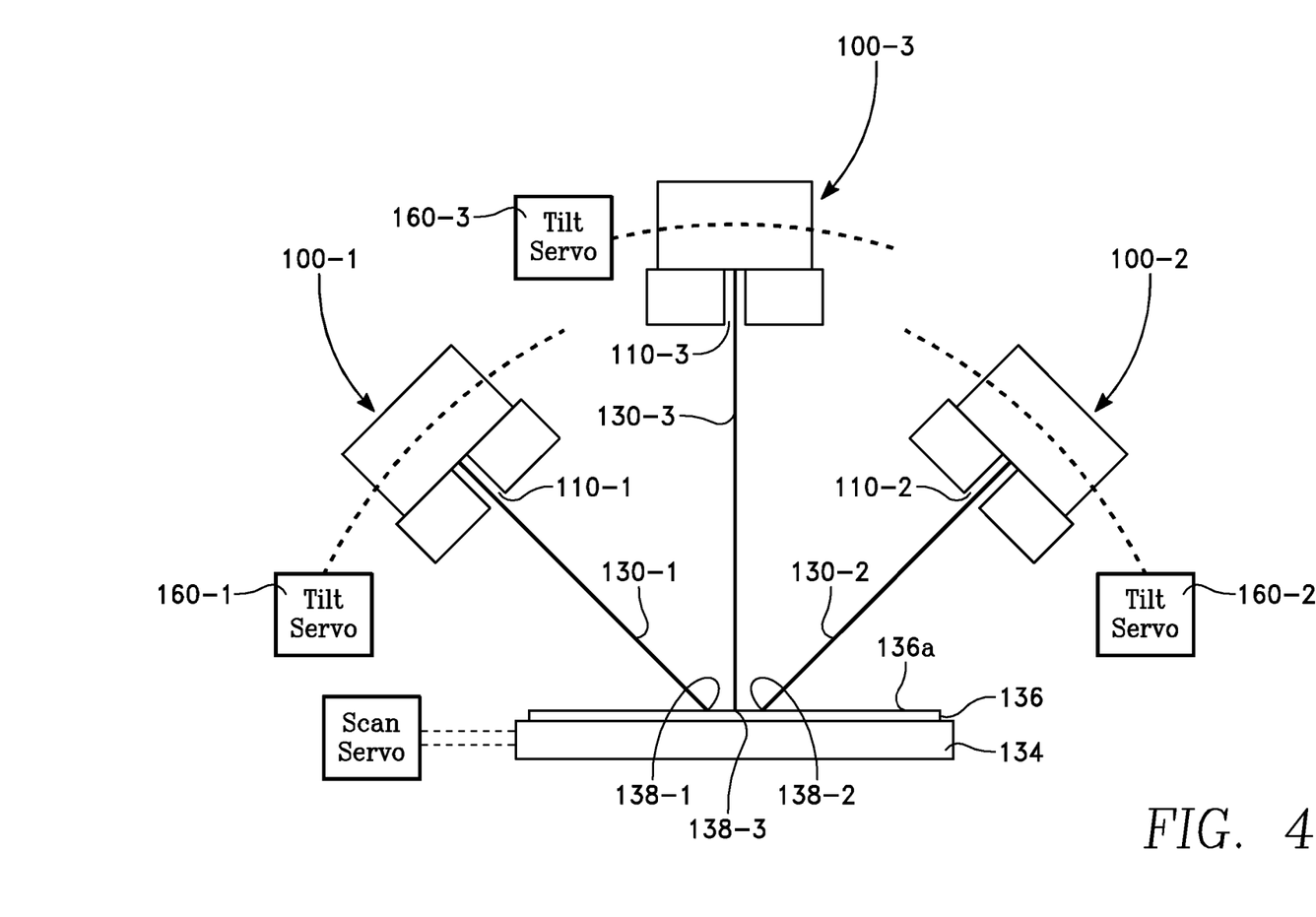
FIG. 4 depicts apparatus including three neutral beam sources and a scanning support stage for carrying out a third embodiment.
Figure 5:
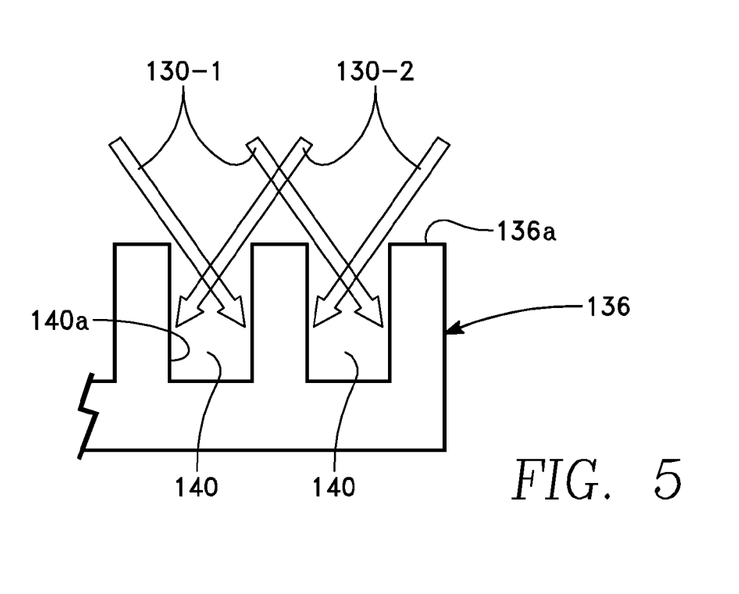
FIG. 5 is a cross-sectional view of a semiconductor wafer and depicts material treatment in the embodiment of FIG. 3.

FIG. 4 depicts an embodiment in which three neutral beam sources 100-1, 100-2, 100-3 having parallel slits 110-1, 110-2, 110-3, respectively, overlie the support stage 134 and produce line beams 130-1, 130-2, 130-3, defining respective beam impact zones or lines 138-1, 138-2, 138-3 on the top surface 136a of the workpiece 136. Respective tilt servos 160-1, 160-2, 160-3 move the respective neutral beam sources 100-1, 100-2, 100-3 in respective orbital-like motions of the type described above with reference to FIG. 1 about respective axes coinciding with the lines 138-1, 138-2, 138-3, respectively. The neutral beam sources 100-1, 100-2, 100-3 are independent and may be controlled to produce the respective line beams 130-1, 130-2, 130-3 with different beam energies. This facilitates the simultaneous treatment of the workpiece 136 with three different beam energies at three different beam tilt angles, as depicted in FIG. 5.

Figure 6:
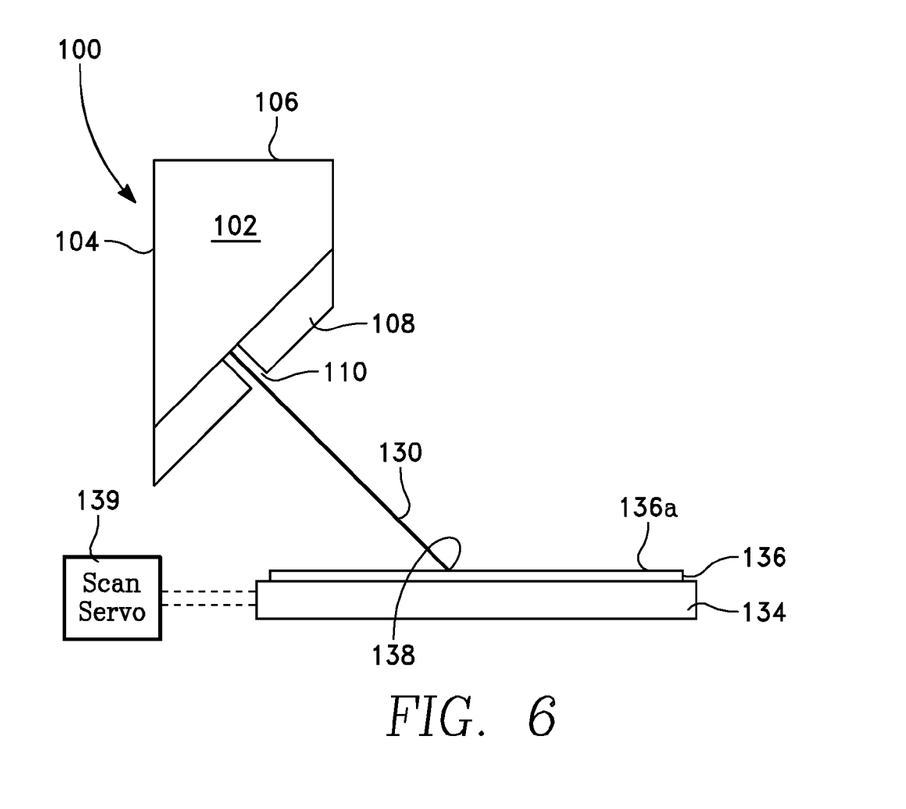
FIG. 6 depicts apparatus including a neutral beam source and a scanning support stage for carrying out a fourth embodiment.
Figure 6A:
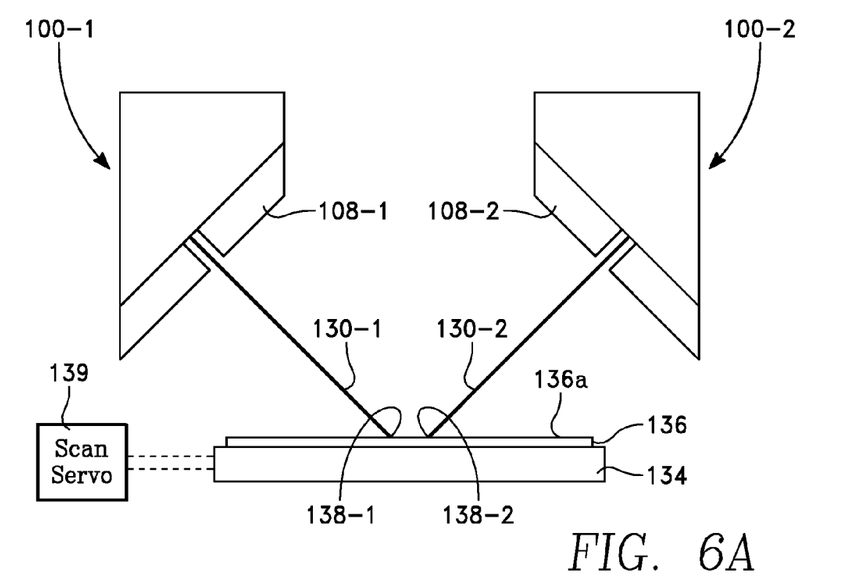
FIG. 6A depicts apparatus including two neutral beam sources and a scanning support stage for carrying out a fifth embodiment.
Figure 7:
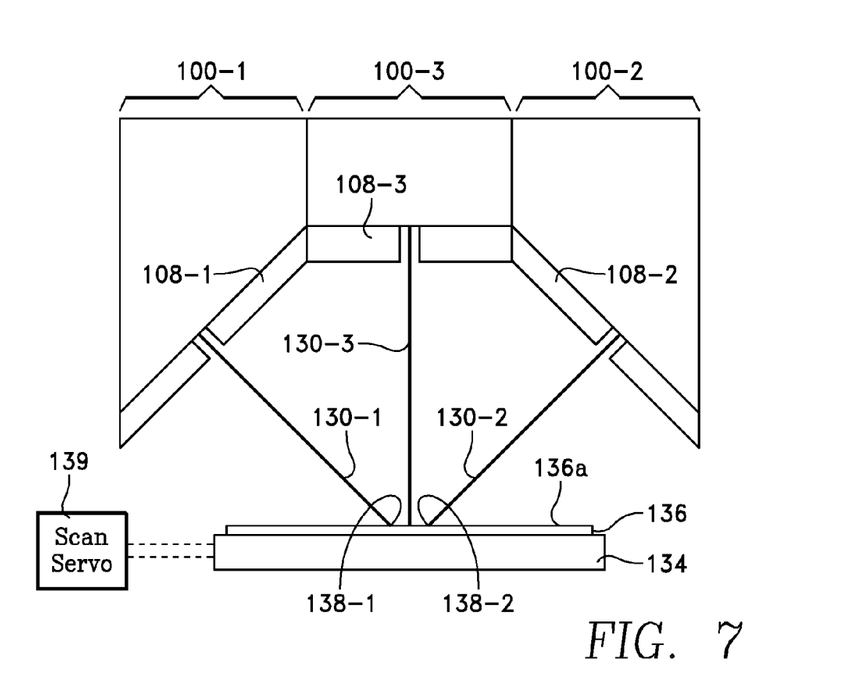
FIG. 7 depicts apparatus including three neutral beam sources and a scanning support stage for carrying out a sixth embodiment.

FIG. 6 depicts a modification of the embodiment of FIG. 1, in which the neutralization grid 108 is angled relative to the ceiling 106 and side walls 104 of the plasma chamber 102 of the neutral beam source 100. In FIG. 6, the desired tilt angle A of the line beam 130 relative to the workpiece 136 is achieved by orienting the neutralization grid 108 relative to the other components of the neutral beam source 100. FIG. 6A depicts a modification of the embodiment of FIG. 3 having the two neutral beam sources 100-1, 100-2, in which neutralization grids 108-1 and 108-2 are each angled relative to the respective neutral beam sources 100-1, 100-2. In FIG. 6A, the desired tilt angles of the line beams 130-1 and 130-2 relative to the workpiece 136 are achieved by orienting the neutralization grids 108-1 and 108-2. FIG. 7 depicts a modification of the embodiment of FIG. 4 having the three neutral beam sources 100-1, 100-2, 100-3, in which the neutralization grids 108-1, 108-2 and 108-3 are each angled relative to the respective neutral beam sources 100-1, 100-2, 100-3. In FIG. 7, the desired tilt angles of the line beams 130-1, 130-2 and 130-3 relative to the workpiece 136 are achieved by orienting the neutralization grids 108-1, 108-2 and 108-3 relative to the neutral beam sources 100-1, 100-2 and 100-3.

Figure 8:
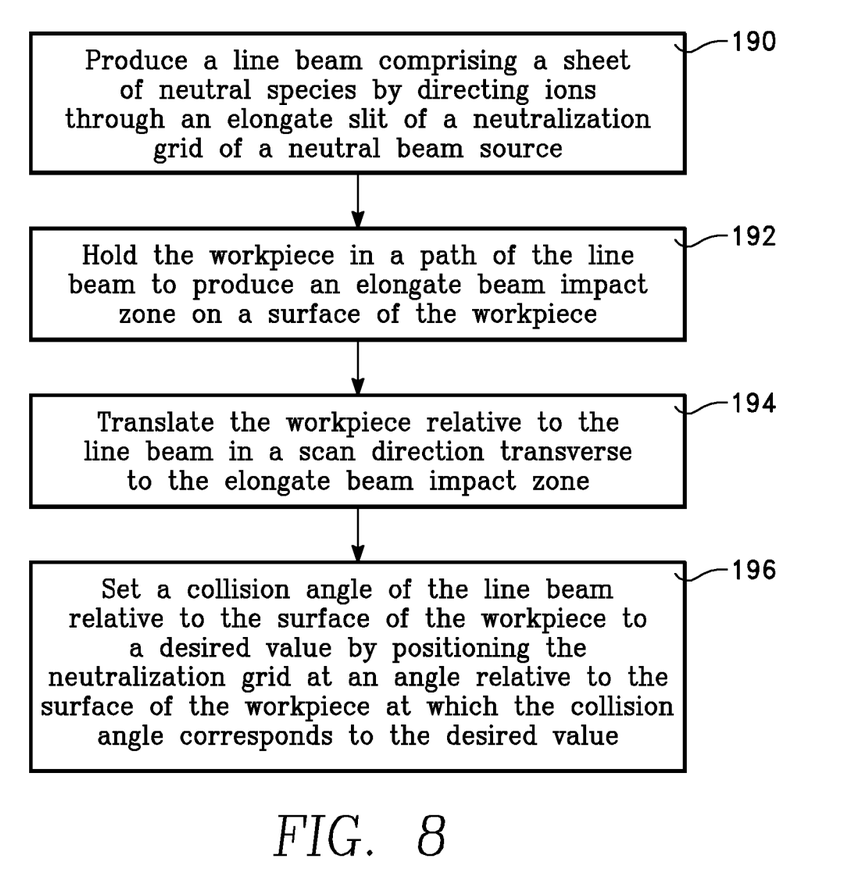
FIG. 8 is a block diagram of method in accordance with an embodiment.

FIG. 8 is block diagram illustrating a brief synopsis of the methods described above. In FIG. 8, a first operation is to produce a line beam comprising a sheet of neutral species by directing ions through an elongate slit of a neutralization grid of a neutral beam source (block 190). A next operation is to hold the workpiece in a path of the line beam to produce an elongate beam impact zone on a surface of the workpiece (block 192). A further operation is to translate the workpiece relative to the line beam in a scan direction transverse to the elongate beam impact zone (block 194). A yet further operation is to set a collision angle of the line beam relative to the surface of the workpiece to a desired value by positioning the neutralization grid at an angle relative to the surface of the workpiece at which the collision angle corresponds to the desired value (block 196).

FIG. 1 depicts a processor 400 (e.g., a computer) controlling the tilt servo 160, the scan servo 139, the plasma source power supply 120 and the gas supply 124. A memory 410, including computer-readable media, contains instructions executed by the processor 400, the respective instructions corresponding to the respective operations of the method of FIG. 8. In one embodiment, the memory 410 may be provided within a network to which the processor 400 is coupled. The processor 400 implements the method of FIG. 8 by carrying out the instructions stored in the memory 410.

Advantages:

Embodiments described above provide a number of advantages. One advantage is that independent control of beam energy and beam angle is provided. The feature of tilting the neutral beam source 100 about an axis until the desired tilt angle is reached, while not tilting the support stage 134 or workpiece 136, provides the advantage of avoiding the introduction of non-uniformities in the workpiece-to-beam source distance during scanning. Performing the rotation of the neutral beam source 100 about an axis coinciding with the beam impact zone or line 138 provides the advantage of keeping the beam impact zone or line 138 stationary relative to a fixed frame of reference while the neutral beam source 100 is tilted.

While the foregoing is directed to embodiments of the present invention, other and further embodiments of the invention may be devised without departing from the basic scope thereof, and the scope thereof is determined by the claims that follow.

What is claimed is:

1. A method of treating a workpiece, comprising:
   producing a line beam comprising a sheet of neutral species by directing ions through an elongate slit of a neutralization grid of a neutral beam source;
   holding the workpiece in a path of said line beam to produce an elongate beam impact zone on a surface of the workpiece;
   translating said workpiece relative to said line beam in a scan direction transverse to said elongate beam impact zone; and
   setting a collision angle of said line beam relative to said surface of the workpiece to a desired value by rotating said neutral beam source.

2. The method of claim 1 wherein said rotating comprises moving said neutral beam source in an orbital motion about a rotation axis external of said neutral beam source.

3. The method of claim 2 wherein said rotation axis coincides with said elongate beam impact zone on said surface of the workpiece.

4. The method of claim 3 wherein said rotation axis is a line corresponding to said beam impact zone.

5. The method of claim 2 wherein said rotating further comprises continually facing said elongate slit toward a stationary location on said surface of the workpiece.

6. The method of claim 5 wherein said stationary location comprises said beam impact zone.

7. The method of claim 1 wherein:
   said producing a line beam comprises producing a plurality of respective line beams comprising respective sheets of neutral species by directing ions through respective elongate slits of respective neutralization grids of respective neutral beam sources;
   said holding the workpiece comprises holding the workpiece in respective paths of said respective line beams to produce respective elongate beam impact zones on a surface of the workpiece; and
   said setting a collision angle comprises setting respective collision angles of said respective line beams relative to said surface of the workpiece to respective desired values by rotating said respective neutral beam sources.

8. The method of claim 7 wherein said rotating comprises moving each of said neutral beam sources in respective orbital motions about respective rotation axes external of said respective neutral beam sources.

9. The method of claim 8 wherein said rotation axes coincide with respective ones of said elongate beam impact zones on said surface of the workpiece.

10. The method of claim 9 wherein said rotation axes comprise respective lines corresponding to said respective beam impact zones.

11. The method of claim 8 wherein said rotating further comprises continually facing said respective elongate slits toward respective stationary locations on said surface of the workpiece.

12. The method of claim 11 wherein said respective stationary locations comprise said respective beam impact zones.

13. The method of claim 7 further comprising applying different voltages to different ones of said respective neutralization grids, whereby said respective neutral beams have different energies.

14. A method of treating a workpiece, comprising:
producing a line beam comprising a sheet of neutral species by directing ions through an elongate slit of a neutralization grid of a neutral beam source;
holding the workpiece in a path of said line beam to produce an elongate beam impact zone on a surface of the workpiece;
translating said workpiece relative to said line beam in a scan direction transverse to said elongate beam impact zone; and
setting a collision angle of said line beam relative to said surface of the workpiece to a desired value by positioning said neutralization grid at an angle relative to said surface of the workpiece at which said collision angle corresponds to said desired value.

15. The method of claim 14 wherein:
said producing comprises producing respective line beams comprising respective sheets of neutral species by directing ions through respective elongate slits of respective neutralization grids;
said holding comprises holding the workpiece in paths of said respective line beams to produce respective elongate beam impact zones on a surface of the workpiece; and
said setting comprises setting respective collision angles of said respective line beams relative to said surface of the workpiece to respective desired values by positioning said respective neutralization grids to respective angles relative to said surface of the workpiece at which said respective collision angles correspond to said respective desired values.

16. The method of claim 15 further comprising providing different beam acceleration voltages in different ones of the respective neutral beam sources, whereby said respective line beams have different energies.

17. A processing apparatus, comprising:
a workpiece support stage capable of supporting a workpiece having a workpiece surface;
a source of a neutral beam, said neutral beam being shaped as a sheet having an elongate beam impact zone on said workpiece surface;
a scan servo coupled to said workpiece support stage and having a scan direction transverse to said elongate beam impact zone;
a beam angle control servo coupled to said source of a neutral beam and capable of rotating said source of a neutral beam about a rotation axis parallel with said elongate beam impact zone.

18. The processing apparatus of claim 17 wherein said rotation axis coincides with said elongate beam impact zone.

19. The processing apparatus of claim 17 wherein said source of a neutral beam comprises a voltage source and wherein energy of said neutral beam is a function of said voltage source.

20. The processing apparatus of claim 19 wherein said source of a neutral beam comprises a plasma chamber having an opening and a neutralization grid facing said opening and comprising an elongate slit defining the shape of said neutral beam.

* * * * *